United States Patent
Sanchez et al.

(10) Patent No.: US 6,703,681 B2
(45) Date of Patent: Mar. 9, 2004

(54) VARIABLE-CAPACITANCE CAPACITOR

(75) Inventors: Jean-Louis Sanchez, Escalquens (FR); Jean-Pierre Laur, Albi (FR); Hedi Hakim, Merkezchihya (TN); Patrick Austin, Bonrepos-Riquet (FR); Jean Jalade, Castanet-Tolosan (FR); Marie Breil, Toulouse (FR)

(73) Assignee: Centre National de la Recherche Scientifique, Paris Cedex 16 (FR)

( * ) Notice: Subject to any disclaimer, the term of this patent is extended or adjusted under 35 U.S.C. 154(b) by 0 days.

(21) Appl. No.: 10/275,787

(22) PCT Filed: May 9, 2001

(86) PCT No.: PCT/FR01/01401
§ 371 (c)(1),
(2), (4) Date: May 16, 2003

(87) PCT Pub. No.: WO01/86729
PCT Pub. Date: Nov. 15, 2001

(65) Prior Publication Data
US 2003/0183866 A1 Oct. 2, 2003

(30) Foreign Application Priority Data
May 9, 2000 (FR) .............................................. 00/05887

(51) Int. Cl.⁷ .............................................. H01L 29/00
(52) U.S. Cl. ........................ 257/532; 257/534; 257/595; 257/599
(58) Field of Search ................................ 257/312, 595, 257/599, 600, 532, 534; 607/2; 361/321.2, 321.5; 600/300

(56) References Cited

U.S. PATENT DOCUMENTS 6,484,054 B2 * 11/2002 Weijand et al. ................. 607/2
6,628,502 B2 *  9/2003 Masumiya et al. ...... 361/321.2

FOREIGN PATENT DOCUMENTS

| DE | 1947300 | 4/1970 |
| GB | 2305002 | 3/1997 |
| JP | 59033884 | 2/1984 |

* cited by examiner

*Primary Examiner*—Roy Potter
(74) *Attorney, Agent, or Firm*—Duane Morris LLP

(57) ABSTRACT

The invention concerns a variable capacitance capacitor comprising a periodic structure of raised zones (5) separated by recesses (6) formed in a type N semiconductor substrate (1). The walls of the raised zones and the base of the recesses are coated with a conductive layer (9, 10). The substrate is connected to a first terminal (A) of the capacitor and the conductive layer to a second terminal (B) of the capacitor. At least the base of the recesses or the side of the raised zones comprises type P regions (8), the pitch of the raised parts being selected so that the space charging zones linked to the type P regions are joined when the voltage difference between said terminals exceeds a predetermined threshold. The zones not comprising type P regions are coated with an insulant (7) and a highly doped N region (10) is formed beneath the insulant.

24 Claims, 5 Drawing Sheets

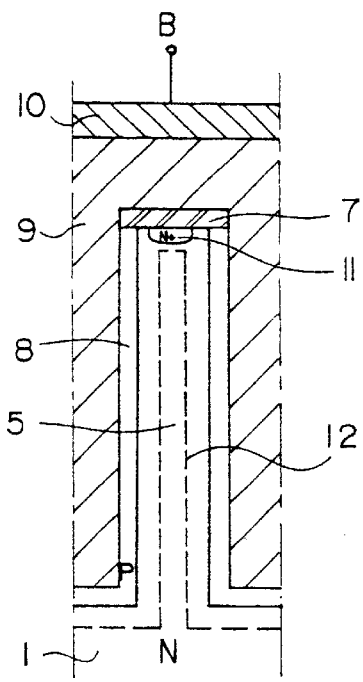
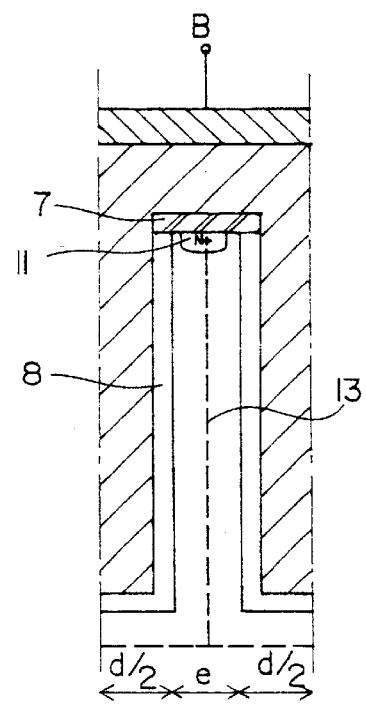
Fig 5A  Fig 5B
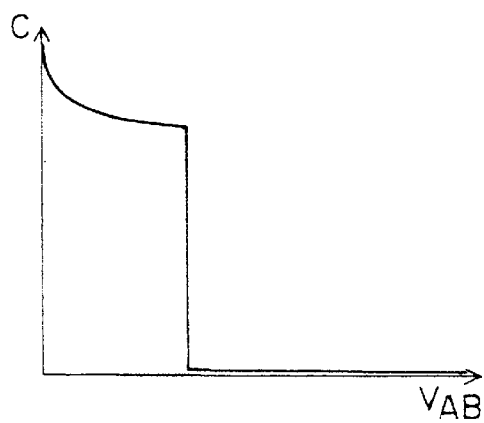
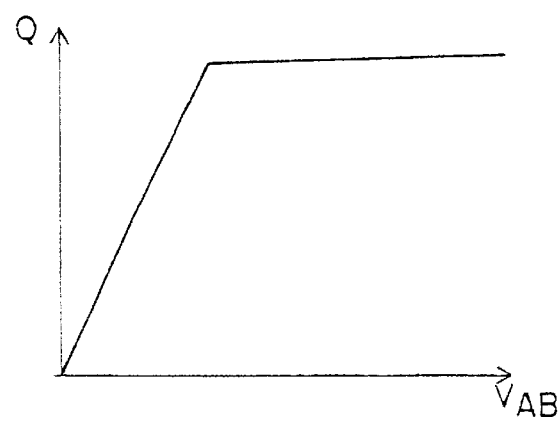
Fig 6A  Fig 6B

VARIABLE-CAPACITANCE CAPACITOR

The present invention relates to variable-capacitance capacitors.

It is known in the art that capacitors, for example corresponding to a reverse-biased junction, have a capacitance which progressively decreases as the voltage there across increases.

Capacitors of this type are for example described in patent GB-A-2305002 of Hewlett-Packard, and illustrated in FIG. 1. Their capacitance-vs-voltage curve is shown in FIG. 2.

FIG. 1 shows a substrate comprising an upper N-type region 1 and a lower N$^+$ type region 2 coated with a metallization 3 connected to a terminal A. The upper surface of the substrate comprises portions in relief 5 separated by recesses 6. An insulating region 7 is formed at the top of relieves 5. A P-type region 8 is formed on the lateral walls of area in relief 5 as well as at the bottom of recesses 6. A conductive layer 9 is formed over the entire upper surface and is coated with a metallization 10 connected to a terminal B.

When a positive voltage is applied on terminal A with respect to terminal B, the PN junction between region 8 and substrate 1 or portion 5 in relief is reverse biased and corresponds to a capacitor.

FIG. 2 shows the variation of capacitance C of the capacitor thus formed as the voltage increases. For small values of voltage $V_{AB}$, capacitance C is substantially proportional to the perimeter of the elementary capacitor pattern. Indeed, the capacitance per surface area unit of the upper part of the structure shows little difference with the capacitance per surface area unit of a junction, due to the fact that the semiconductor part in relief is lightly doped. As the space charge area extends, the capacitance progressively decreases until, at the time when the space charge areas join, it can be considered that the capacitance of the area in relief is inhibited, that is, its contribution to the value of the capacitance disappears. For a threshold value $V_T$ of the voltage, the capacitance of a pattern then passes from a state where it is substantially proportional to the perimeter of a relief to a state where it is proportional to the pitch of a pattern. A capacitor having a capacitance which varies progressively during a first phase, then drops for a threshold voltage $V_T$ is thus obtained. However, as shown in FIG. 2, most of the capacitance drop is progressive, and the "switched" portion only corresponds to a small part of the total capacitance variation.

An object of the present invention is to provide a capacitor having a capacitance which abruptly decreases when the voltage thereacross exceeds a predetermined threshold.

To achieve this object, the present invention provides a capacitor with a variable capacitance comprising a periodic structure of areas in relief separated by recesses formed in a semiconductor substrate of a first doping type, in which the walls of the areas in relief and the bottom of the recesses are coated with a conductive layer, the substrate being connected to a first terminal of the capacitor and the conductive layer to a second terminal of the capacitor, in which at least the bottom of the recesses or the side of the areas in relief comprises regions of the second doping type, the pitch of the portions in relief being selected so that the space charge areas linked to the regions of the second doping type join when the voltage difference between said terminals exceeds a determined threshold. The areas which do not comprise the regions of the second doping type are coated with an insulator and a heavily-doped region of the conductivity type of the substrate is formed under the insulator.

According to an embodiment of the present invention, the conductive layer comprises a polysilicon layer of the second doping type coated with a metallization.

According to an embodiment of the present invention, the areas in relief form ribs.

According to an embodiment of the present invention, the areas in relief and the recesses form a multicellular structure.

According to an embodiment of the present invention, the bottom of the recesses as well as the lateral walls of the areas in relief comprise a region of the second doping type.

According to an embodiment of the present invention, the bottom of the recesses comprises a region of the second doping type while the lateral walls and the upper part of each area in relief are coated with a dielectric layer, the areas in relief being heavily doped.

The present invention also aims at a use of the above-mentioned capacitor in a circuit likely to exhibit across the capacitor a value greater or smaller than said threshold voltage.

According to an embodiment of the present invention, the capacitor comprises at its periphery a heavily-doped isolating wall of the second conductivity type extending from the upper surface to the lower surface of the substrate, connected to said conductive layer and distant from the limit of the lower surface metallization by a distance sufficient to hold a desired voltage.

According to an embodiment of the present invention, on the lower surface side of the substrate, a silicon oxide layer is deposited at the component periphery beyond the lower surface metallization.

The present invention also aims at the use of the above-mentioned capacitor in a circuit likely to exhibit across the capacitor a value greater or smaller than said threshold voltage.

The foregoing objects, features and advantages of the present invention will be discussed in detail in the following non-limiting description of specific embodiments in connection with the accompanying drawings.

FIG. 1, previously described, is a simplified cross-section view of a variable-capacitance capacitor according to prior art;

FIG. 2, previously described, shows the capacitance versus the voltage of the capacitor of FIG. 1;

FIGS. 5A and 5B show a partial cross-section view of a capacitor according to the first embodiment of the present invention;

Figure 7:
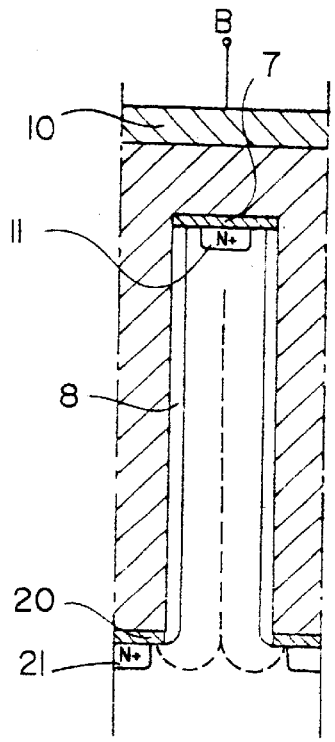
Figure 8A:
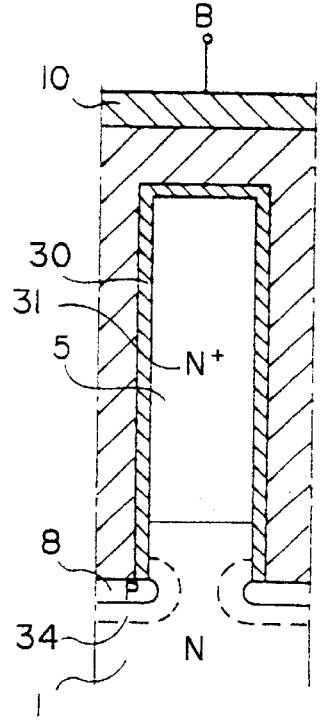
Figure 8B:
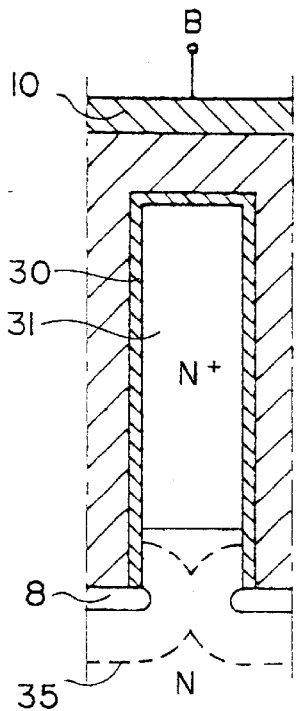
Figures 9A, 9B:
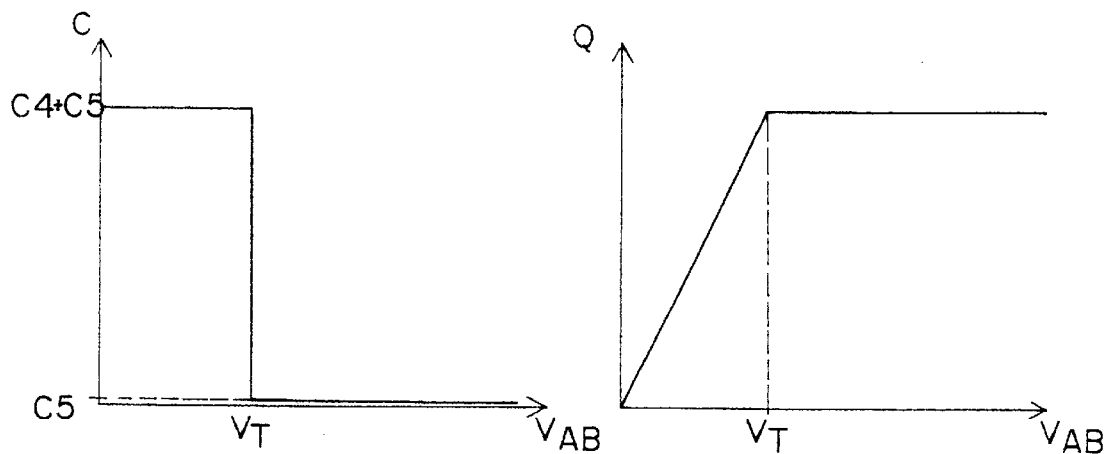
Figure 10:
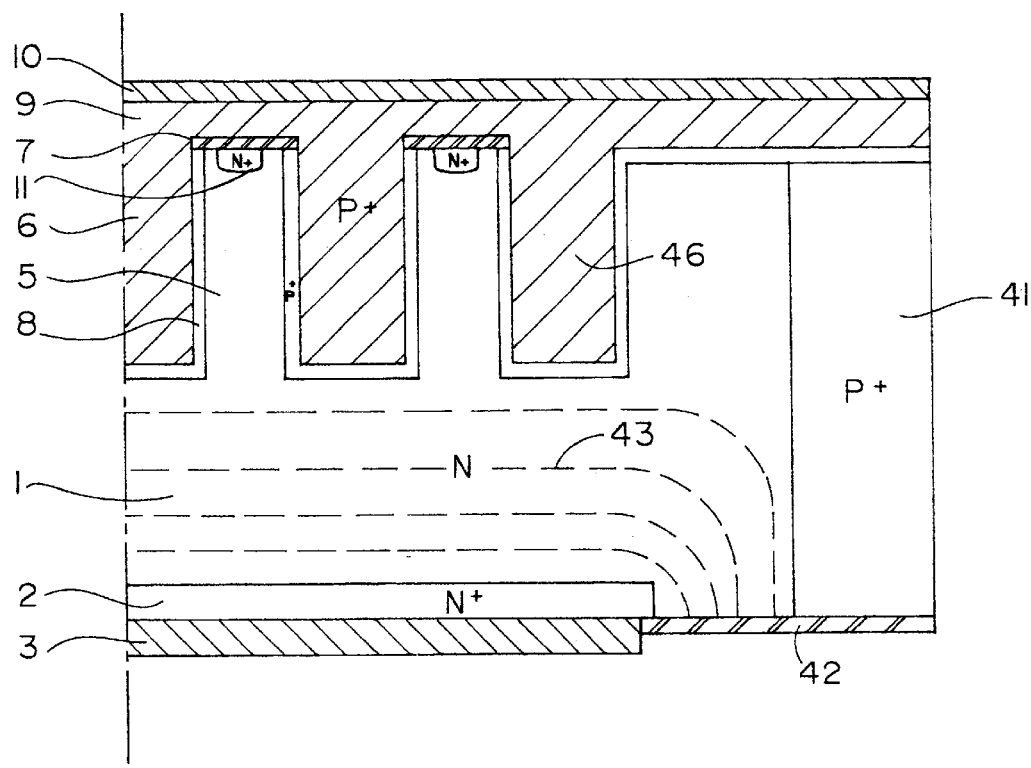

FIGS. 6A and 6B respectively show the capacitance versus the voltage and the charge versus the voltage of the capacitor of FIGS. 5A and 5B;

FIG. 7 is a partial cross-section view of an alternative embodiment of a capacitor according to the present invention;

FIGS. 8A and 8B show a partial cross-section view of a second embodiment of a capacitor according to the present invention;

FIGS. 9A and 9B respectively show the capacitance versus the voltage and the charge versus the voltage of the capacitor of FIGS. 8A and 8B; and FIG. 10 shows an embodiment of the peripheral structure adapted to a capacitor according to the present invention.

As usual in the field of semiconductor component representation, the various cross-section views are not drawn to scale. To determine possible dimensions, those skilled in the art will refer to their general experience and to the specific indications given in what follows of the present description.

Figure 1:
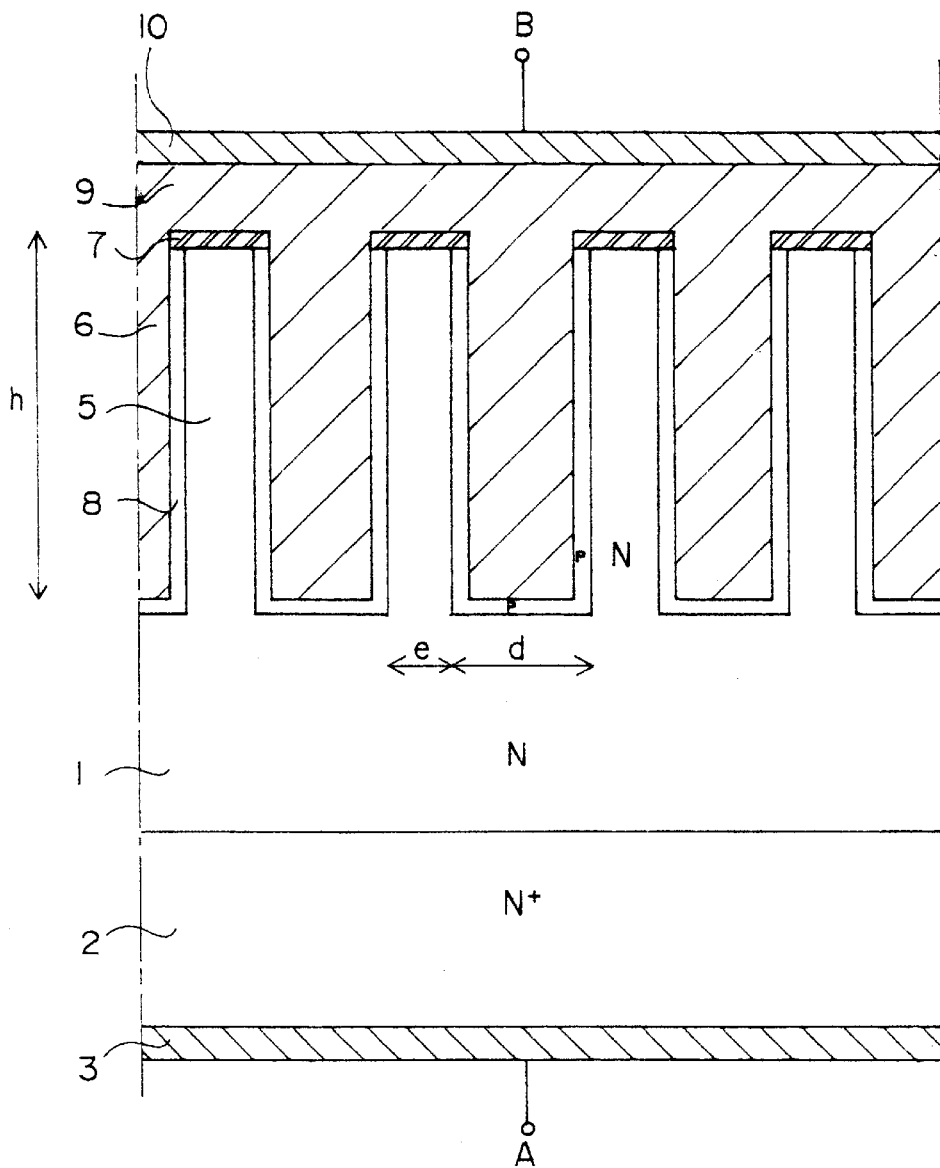
Figure 2:
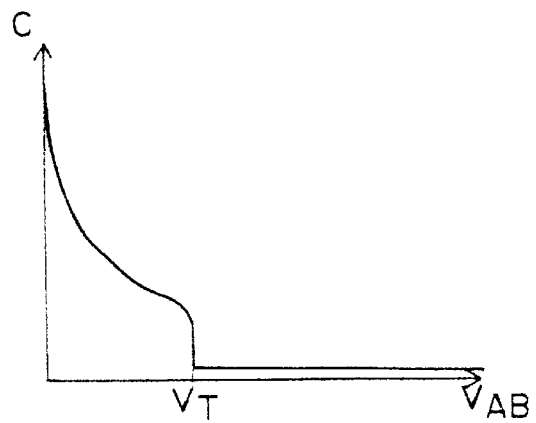
Figure 3:
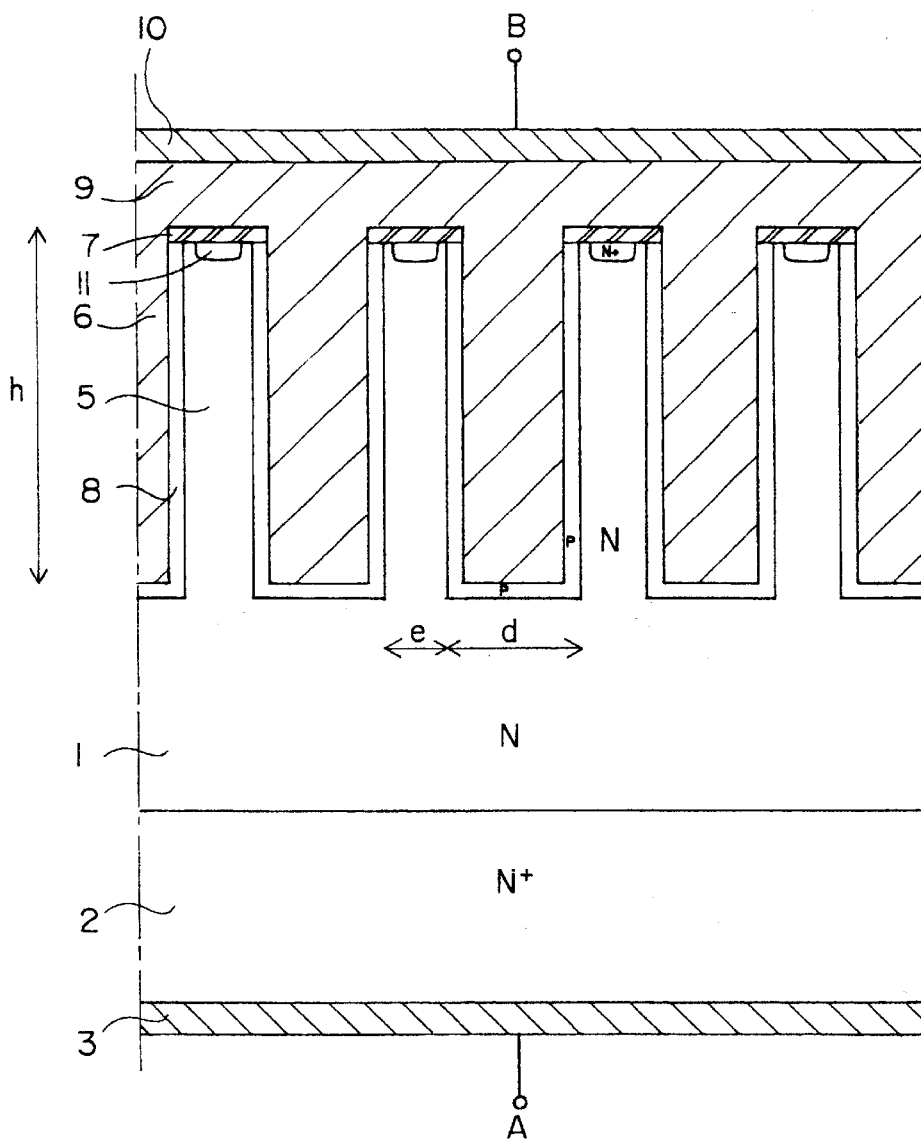
FIG. 3 shows a simplified cross-section view of a first embodiment of a variable-capacitance capacitor according to the present invention.

FIG. 3 is a partial cross-section view of a capacitor according to an embodiment of the present invention formed in a semiconductor layer. This capacitor is generally similar to that of FIG. 1 but further comprises a heavily-doped N-type region under the portions of insulating layer 7.

The substrate may correspond to an N-type semiconductor wafer 1, the rear surface 2 of which has undergone a doping at higher concentration to form region 2, or to a heavily-doped N$^+$-type semiconductor wafer 2 on which a more lightly doped region 1 has been formed, for example, by epitaxy.

Conductive layer 9 for example is a P-type doped polysilicon layer and is coated with a metallization 10. In the embodiment shown, conductive layer 9 completely fills the recesses, but it should be understood that according to the lateral dimensions of the recesses and to the thickness of this layer, there will be or not a complete filling of the recesses. The height of a portion in relief is referred to as h, its width as e (or more exactly, the width of the N-type region), and the pitch of the structure as e+d.

Figure 4A:
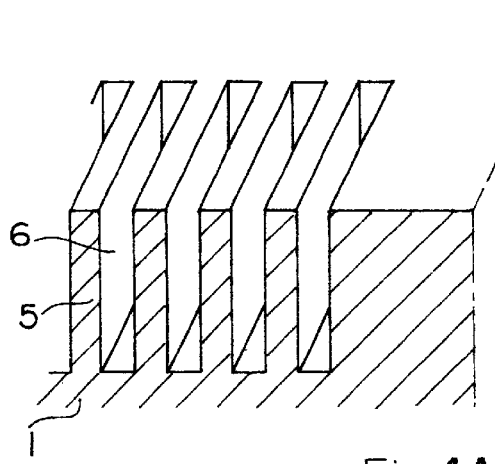
FIGS. 4A and 4B are partial perspective views illustrating embodiments of an upper part of the structure of FIG. 3.
Figure 4B:
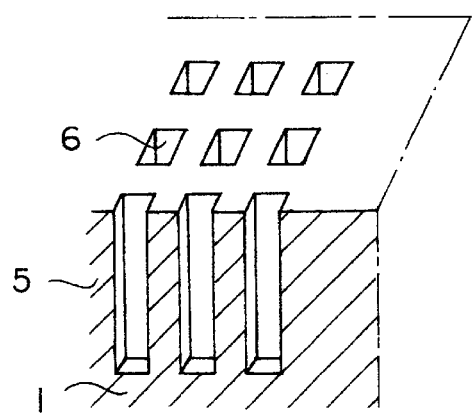

FIGS. 4A and 4B show as an example possible implementations of areas 5 in relief and of recesses 6 in the absence of conductive layer 9 and of metallization 10. In the case of FIG. 4A, the areas in relief correspond to ribs 5 separated by grooves 6. In the case of FIG. 4B, recesses 6 are separate, so that the structure has a multicellular outlook, each recess having for example a triangular, square, rectangular, hexagonal . . . cross-section. Other examples of structures may be envisaged by those skilled in the art. FIGS. 4A and 4B have been drawn only to show that the present invention applies to various configurations of relieves and recesses.

In the next drawings, only a portion in relief surrounded with recesses will be shown. It should however be noted that this applies to what has been illustrated in FIG. 4A as well as to what has been illustrated in FIG. 4B. On the other hand, for simplicity, the portions in relief and the recessed portions will be referred to hereafter as ribs and grooves. Those skilled in the art should however note that the following description also applies to a structure of multicellular type such as that in FIG. 4B. Further, it will be assumed hereafter that there is a large number of elementary cells so that edge effects are negligible.

FIG. 5A shows at an enlarged scale a rib 5 of FIG. 3. The rib walls as well as the bottom of the neighboring recesses comprise a P-type region 8. This P region is much more heavily-doped than the N substrate. N$^+$-type region 11 preferably does not extend to the P region to avoid reducing the breakdown voltage of the device. Region 11 results for example from an implantation. When the voltage between terminals A and B increases in the direction in which the junction is blocked, a space charge area, shown in FIG. 5A as delimited by dotted lines 12, extends inwards with respect to the contour of P-type region 8.

In FIG. 5B, the same structure has been shown, but in the case where the space charge areas extending from opposite walls and opposite bottom regions of the rib join at center 13 of the rib.

FIG. 6A shows the variation of capacitance C of the capacitor thus formed as the voltage increases. Due to the presence of heavily-doped region 11 and to the choice of a small thickness for insulator 7, dielectric capacitance C1 corresponding to insulated region 7 is high. Thus, total capacitance C of the capacitor is higher than in the case of FIG. 1. For smaller values of voltage $V_{AB}$, as the space charge area extends, capacitance C drops by approximately as much as in the case of FIG. 1, but only for the portion corresponding to junction capacitance C2. At the time when the space charge areas join in accordance to what is shown in FIG. 5B, the rib can be considered as being inhibited, that is, the contribution of capacitance C1 to the value of total capacitance C disappears. The capacitance then abruptly drops, for a threshold value $V_T$ of the voltage, to a small value. The threshold value especially depends on the doping level of substrate N and on the thickness of each rib (or rather, referring to the embodiment of FIG. 4B, on the distance between two adjacent recesses).

FIG. 6B shows charge Q stored in the capacitor versus applied voltage $V_{AB}$. This charge first relatively rapidly increases (proportionally to the relatively high initial value of the capacitance), then very slowly increases (proportionally to the relatively low value of the capacitance).

FIG. 7 shows an alternative embodiment of a structure according to the present invention, and the dotted lines show the extension of the space charge areas at the time of the capacitance switching. The bottom of each recess is coated with a dielectric 20 under which is formed an N$^+$ region 21 and corresponds to a dielectric capacitance C3. Calling C1 the dielectric capacitance of the upper region and C2 the junction capacitance of the rib sides, the capacitance value will switch from C1+C2+C3 to C3. The minimum, which corresponds to a dielectric capacitance, has a better-defined value than a junction capacitance.

FIGS. 8A and 8B show a second embodiment of the present invention. In this alternative, the lateral and upper walls of each rib 5 formed in substrate 1 are coated with a dielectric layer 30, currently a silicon oxide layer, and practically the entire height of rib 5 corresponds to an N$^+$ region 31. P-type area 8 is limited to the lower wall of each recess. In FIG. 8A, the limit of the space charge area is designated by dotted lines 34. This space charge area extends inwards from P-type doped area 8. In the configuration illustrated in FIG. 8B, the voltage applied between terminals A and B has become sufficient for the space charge areas 35 extending from each of P-type regions 8 to join at the foot of rib 5. Then, there exists an area emptied of carriers between the substrate and the N-type region forming the rib, and it can be considered that the material of this rib is isolated from the substrate, that is, from terminal A of the capacitor.

At the first order, it can be here considered that there is, between A and B, a capacitance equivalent to the series assembly of a dielectric capacitance of value $C4 \cong (2h+e)C_{ox}$ and of a capacitance linked to an emptied layer of value $C5 \cong (e+d)C_{si}$.

Then, the capacitance variation according to the applied voltage is such as shown in FIG. 9A. It has a substantially constant value C4+C5 as long as threshold value $V_T$ has not been reached, after which it rapidly drops to very low value C5 as soon as voltage $V_T$ is exceeded.

FIG. 9B shows the variation of stored charge Q. First, it is equal to C1V, then, once voltage $V_T$ has been reached, and assuming that the residual capacitance is then very small, it remains substantially constant and equal to $C1V_T$.

The variable-capacitance capacitor according to the present invention may be used in various circuits in which it is desired that, when the voltage across the capacitor exceeds a predetermined threshold, the value of the capacitance of this capacitor abruptly decreases. An example of such a circuit is that of a turn-off assistance capacitor arranged in parallel on a controlled static switch. At the transistor turning-off, the current flowing through the switch flows into the capacitor, which improves turn-off conditions by decreasing switching losses. For this transition to occur properly, it is desirable for the capacitor to have a relatively high value during the entire current decrease. However, as soon as the switch is off and the voltage thereacross has started increasing, it is desirable not to increase the charge stored in the capacitor. Thus, a capacitor with an abrupt capacitance drop according to the present invention is particularly desirable in such applications.

No detailed manufacturing mode of the structures according to the present invention has been described herein. Indeed, those skilled in the art may use various anisotropic etch methods to dig trenches or other relatively deep openings, of a height on the order of from 80 to 150 μm in a semiconductor silicon wafer. On the other hand, various types of anisotropic etch enabling etching the bottom and/or the upper surface of a rib without etching its lateral walls are known. Such etch techniques, associated with doped polysilicon and dielectric deposition techniques, enable obtaining the various alternative embodiments with walls coated with a dielectric or with walls doped with a dopant of a type opposite to that of the substrate.

It should also be noted that the capacitor according to the present invention, the electrodes of which are located on either side of a semiconductor wafer, is well adapted to belonging to a monolithic structure comprising, in addition to this capacitor, at least one power switch of vertical or lateral type as well as other active or passive devices.

Various other alternatives of the present invention will occur to those skilled in the art without departing from the field of the present invention such as defined in the appended claims. Especially, the described doping types may be reversed.

FIG. 10 shows an example of a peripheral structure adapted to a capacitor according to the present invention.

If it is desired for a device according to the present invention to hold a high voltage, capable of reaching several hundreds of volts and even values ranging to 2,000 volts, conventional peripheral structures of vertical high-voltage components appear not to be adapted. Indeed, conventionally, peripheral structures such that the equipotential surfaces spread laterally and end towards the top of the sides of the chip are provided. In the case of a capacitor according to the present invention, given the great depth of the grooves formed in the substrate, simulations show that these peripheral structures are not adapted, since a strongly marked curvature of the equipotential surfaces appears at the bottom of the most external groove, and breakdown voltages greater than a few hundred volts will be very difficult to obtain.

An aspect of the present invention is to provide a peripheral structure adapted to the capacitor of the present invention and enabling holding very high voltages. An example of such a peripheral structure is illustrated in FIG. 10. The structure is such that the equipotential surfaces, instead of closing towards the top, as conventional, close towards the bottom of the chip.

In the left-hand portion of FIG. 10, is shown a capacitor structure according to the present invention such as illustrated in FIG. 3, the various elements of which are designated with same reference numerals.

At the component periphery, as seen at the far right of FIG. 10, lower metallization 3 is interrupted as well as heavily-doped $N^+$-type region 2. The structure edge is occupied by a P-type isolating wall 41, which extends from one surface of the component to the other. On the lower surface side, a region covered with an oxide layer 42 extends between the end of metallization 3 and the structure periphery, under $P^+$ region 41, and under a portion of the edge of substrate 1. Thus, the equipotential lines, designated with references 43, fold up no longer towards the upper surface of the substrate, but towards the lower surface, and no longer exhibit an area with a very high curvature. Provided to properly choose the distance between isolating wall 41 and the limit of $N^+$ region 2 and of metallization 3, the component will be able to hold a very high voltage, up to several thousands of volts. The distance between isolating wall 41 and the last capacitor groove, designated with reference numeral 46, will of course have to be properly chosen.

Of course, various conventional means capable of favoring the equipotential surface spreading may be added to the present invention. For example, a $P^-$ region may be provided in the vicinity of the lower part of $P^+$ wall 41, field plates may be used . . .

What is claimed is:

1. A capacitor with a variable capacitance comprising a periodic structure of areas in relief (5) separated by recesses (6) formed in a semiconductor substrate (1) of a first doping type, in which the walls of the areas in relief and the bottom of the recesses are coated with a conductive layer (9, 10), the substrate being connected to a first terminal (A) of the capacitor and the conductive layer to a second terminal (B) of the capacitor, in which at least the bottom of the recesses or the side of the areas in relief comprises regions (8) of the second doping type, the pitch of the portions in relief being selected so that the space charge areas linked to the regions of the second doping type join when the voltage difference between said terminals exceeds a determined threshold, characterized in that the areas which do not comprise the regions of the second doping type are coated with an insulator (7, 20, 30) and in that a heavily-doped region (11) of the conductivity type of the substrate is formed under the insulator.

2. The capacitor of claim 1, characterized in that the conductive layer comprises a polysilicon layer (9) of the second doping type coated with a metallization (10).

3. The capacitor of claim 1, characterized in that the areas in relief form ribs.

4. The capacitor of claim 1, characterized in that the areas in relief and the recesses form a multicellular structure.

5. The capacitor of claim 1, characterized in that the bottom of the recesses as well as the lateral walls of the areas in relief comprise a region of the second doping type (8).

6. The capacitor of claim 1, characterized in that the bottom of the recesses comprises a region of the second doping type while the lateral walls and the upper part of each area in relief are coated with a dielectric layer (30), the areas in relief being heavily doped.

7. A use of the capacitor of claim 1 in a circuit likely to exhibit across the capacitor a value greater or smaller than said threshold voltage.

8. A use of the capacitor of claim 2 in a circuit likely to exhibit across the capacitor a value greater or smaller than said threshold voltage.

9. A use of the capacitor of claim 3 in a circuit likely to exhibit across the capacitor a value greater or smaller than said threshold voltage.

10. A use of the capacitor of claim 4 in a circuit likely to exhibit across the capacitor a value greater or smaller than said threshold voltage.

11. A use of the capacitor of claim 5 in a circuit likely to exhibit across the capacitor a value greater or smaller than said threshold voltage.

12. A use of the capacitor of claim 6 in a circuit likely to exhibit across the capacitor a value greater or smaller than said threshold voltage.

13. The capacitor of claim 1 characterized in that it comprises at its periphery a heavily doped isolating wall (41) of the second conductivity type extending from the upper surface to the lower surface of the substrate, connected to said conductive layer (9, 10) and distant from the limit of the lower surface metallization (3) by a distance sufficient to hold a desired voltage.

14. The capacitor of claim 2 characterized in that it comprises at its periphery a heavily doped isolating wall (41) of the second conductivity type extending from the upper surface to the lower surface of the substrate, connected to said conductive layer (9, 10) and distant from the limit of the lower surface metallization (3) by a distance sufficient to hold a desired voltage.

15. The capacitor of claim 3 characterized in that it comprises at its periphery a heavily doped isolating wall (41) of the second conductivity type extending from the upper surface to the lower surface of the substrate, connected to said conductive layer (9, 10) and distant from the limit of the lower surface metallization (3) by a distance sufficient to hold a desired voltage.

16. The capacitor of claim 4 characterized in that it comprises at its periphery a heavily doped isolating wall (41) of the second conductivity type extending from the upper surface to the lower surface of the substrate, connected to said conductive layer (9, 10) and distant from the limit of the lower surface metallization (3) by a distance sufficient to hold a desired voltage.

17. The capacitor of claim 5 characterized in that it comprises at its periphery a heavily doped isolating wall (41) of the second conductivity type extending from the upper surface to the lower surface of the substrate, connected to said conductive layer (9, 10) and distant from the limit of the lower surface metallization (3) by a distance sufficient to hold a desired voltage.

18. The capacitor of claim 6 characterized in that it comprises at its periphery a heavily doped isolating wall (41) of the second conductivity type extending from the upper surface to the lower surface of the substrate, connected to said conductive layer (9, 10) and distant from the limit of the lower surface metallization (3) by a distance sufficient to hold a desired voltage.

19. The capacitor of claim 1, characterized in that, on the lower surface side of the substrate, a silicon oxide layer (42) is deposited at the component periphery beyond the lower surface metallization (3).

20. The capacitor of claim 2, characterized in that, on the lower surface side of the substrate, a silicon oxide layer (42) is deposited at the component periphery beyond the lower surface metallization (3).

21. The capacitor of claim 3, characterized in that, on the lower surface side of the substrate, a silicon oxide layer (42) is deposited at the component periphery beyond the lower surface metallization (3).

22. The capacitor of claim 4, characterized in that, on the lower surface side of the substrate, a silicon oxide layer (42) is deposited at the component periphery beyond the lower surface metallization (3).

23. The capacitor of claim 5, characterized in that, on the lower surface side of the substrate, a silicon oxide layer (42) is deposited at the component periphery beyond the lower surface metallization (3).

24. The capacitor of claim 6, characterized in that, on the lower surface side of the substrate, a silicon oxide layer (42) is deposited at the component periphery beyond the lower surface metallization (3).

* * * * *